United States Patent [19]

Kingsley

[11] 4,233,514

[45] Nov. 11, 1980

[54] SOLID STATE RADIATION DETECTOR AND ARRAYS THEREOF

[75] Inventor: Jack D. Kingsley, Schenectady, N.Y.

[73] Assignee: General Electric Company, Schenectady, N.Y.

[21] Appl. No.: 969,545

[22] Filed: Dec. 14, 1978

[51] Int. Cl.² ........................ G01T 1/22; G01T 1/24
[52] U.S. Cl. ................................. 250/370; 250/371
[58] Field of Search .................. 357/11, 29; 250/370, 250/371, 445 T, 213 VT

[56] References Cited

U.S. PATENT DOCUMENTS

| | | | |
|---|---|---|---|
| 2,706,791 | 4/1955 | Jacobs et al. | 250/371 |
| 2,706,792 | 4/1955 | Jacobs | 250/371 |
| 4,085,327 | 4/1978 | Swank et al. | 250/370 |

Primary Examiner—Bruce C. Anderson
Attorney, Agent, or Firm—Geoffrey H. Krauss; Marvin Snyder; James C. Davis

[57] ABSTRACT

A layer of X-ray photoconductor is sandwiched between electrodes for conversion of X-radiation to an electrical signal. The photoconductor layer is biased, and films of zinc sulfide may be used between the layer and each electrode, to minimize dark current. Arrays of solid state radiation detectors utilizing the biased photoconductive conversion layer are also disclosed.

29 Claims, 2 Drawing Figures

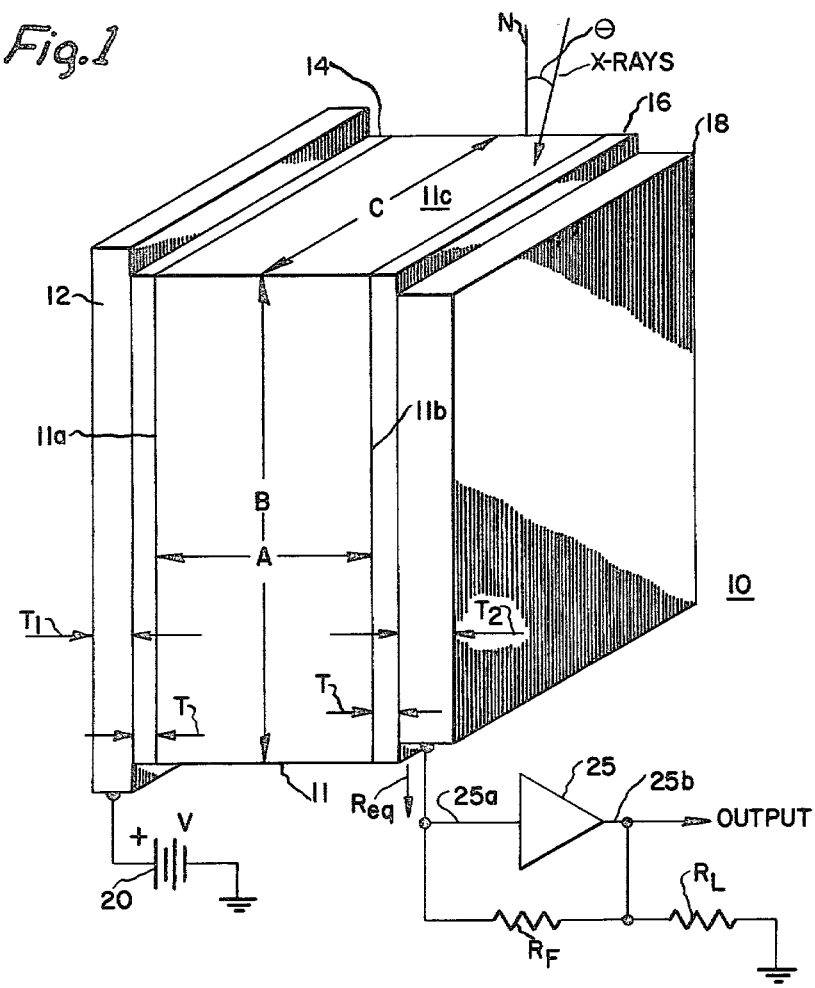
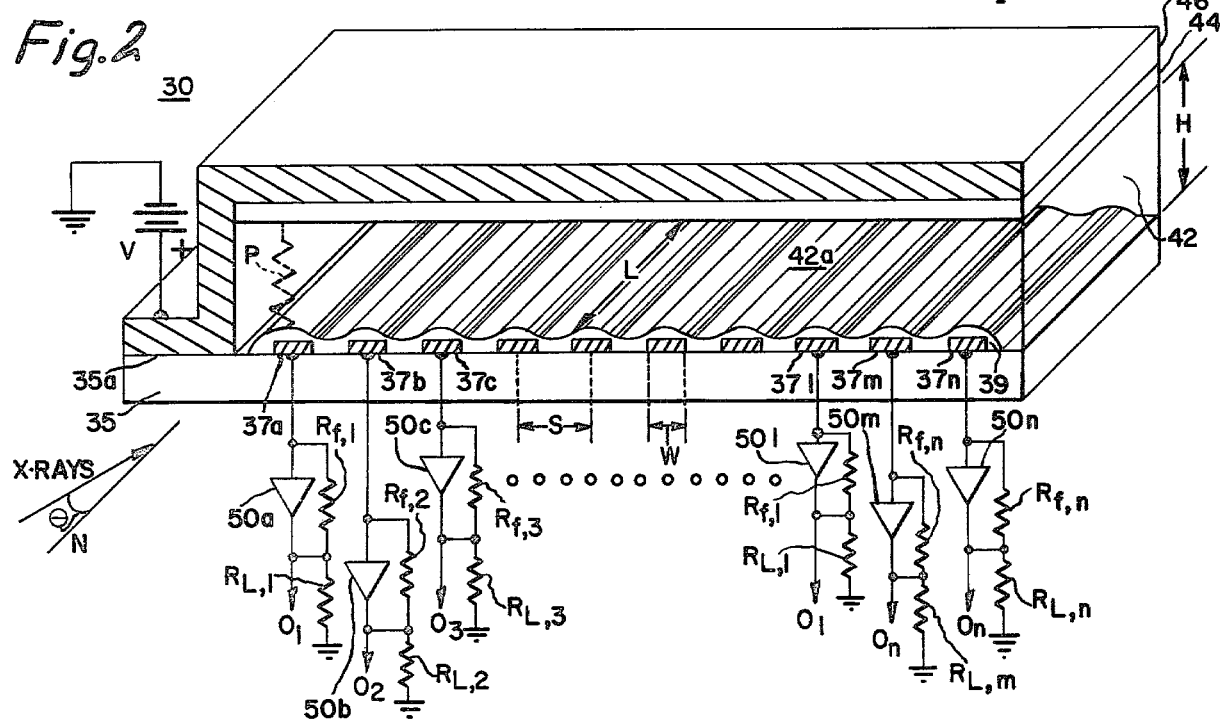

SOLID STATE RADIATION DETECTOR AND ARRAYS THEREOF

BACKGROUND OF THE INVENTION

The present invention relates to radiation detectors and, more particularly, to a novel solid state X-ray detectors and to arrays thereof.

Accurate measurement of radiation flux intensity is required in many applications. In particular, the measurement of X-ray flux intensity in computerized tomography systems, and particularly in very high resolution tomography systems for non-destructive evaluation of mechanical parts, requires a very high degree of accuracy. Increased accuracy is also beneficial in more conventional X-ray imaging systems for medical, industrial or other measurement tasks.

Generally, X-ray flux intensity is acurately measured by utilization of one of two physical processes; a solid state scintillator element may be utilized to convert the X-radiation to emit a luminescent intensity to be measured by an additional device, such as a photomultiplier tube or a silicon photosensitive device; or a gaseous X-radiation photoconductor, such as xenon and the like, is utilized to provide a changing induced conductance therein responsive to the degree of X-radiation ionization. Both principle forms of X-ray flux intensity measuring devices are relatively complex and it is desirable to provide radiation flux detectors of increased simplicity and capable of forming compact arrays thereof, particularly for increasing the accuracy of computerized tomography systems.

BRIEF SUMMARY OF THE INVENTION

In accordance, with the invention, a solid state radiation detector utilizes a layer of a photoconductive material characterized by a change in conductance between opposed boundaries of the layer responsive to changes in incident radiation flux. An electrode is fabricated on each of the opposed boundary surfaces, with the electrode material being selected to minimize dark current flowing through the detector when the detector photoconductor layer is biased.

In one preferred embodiment, wherein the photoconductive material is selenium, a film of zinc sulfide is fabricated upon each of the opposed boundary surfaces prior to fabrication of the electrodes thereon to even further reduce dark current injected across the photoconductive layer.

A detector array utilizes a set of parallel electrodes upon one surface of a photoconductive member, with a common bias electrode, to which a source of bias potential is connected. Each of the plurality of electrodes are individually connected to one of a plurality of output conditioning amplifiers.

Accordingly, it is one object of the present invention to provide a novel solid state radiation-responsive photoconduction detector.

It is another object to provide a novel solid state radiation detector array.

These and other objects of the present invention will become apparent on consideration of the following detailed description, when taken in conjunction with the drawings.

BRIEF DESCRIPTION OF THE DRAWINGS

FIG. 1 is a perspective view of a novel solid state radiation detector in accordance with the principles of the present invention; and FIG. 2 is a perspective view of a solid state radiation detector array utilizing the invention principles.

DETAILED DESCRIPTION OF THE INVENTION

Referring initially to FIG. 1, a solid state radiation detector 10 utilizes a layer 11 having a pair of opposed layer surfaces 11a and 11b. The electrical conductance measurable between the opposed surfaces is responsive to absorption of radiation quanta. In particular, for detection of X-ray flux, layer 11 is fabricated of solid materials such as lead oxide, cadmium selenide, selenium and the like. In the presently preferred embodiment, selenium is utilized as the X-ray-responsive photoconductive material, due to the very low dark conductivity thereof. Selenium, having at atomic number of only 34, is not an optimum X-ray absorber; however, the ease of deposition, as by evaporation and the like proceses, and the previously mentioned very low dark conduction (very high dark resistance, on the order of $10^{15}$ ohm-centimeters) overcome the less-than-optimum radiation absorption characteristics of the material. The selenium layer 11 is deposited to a thickness A of about 500 microns (20 milli-inches) upon one surface of a first electrode 12 having a thickness $T_1$ from about 500 Angstroms to about 6 milli-inches. Advantageously, electrode 12 is a nickel-tungsten member, although, gold, indium oxide, tin oxide, indium tin oxide, nickel-coated tungsten, aluminum and nickel may be equally as well utilized.

It is preferable, although not necessary, that a thin layer, having a thickness T of about 1,000 angstroms, of zinc sulfide be fabricated upon electrode 12 prior to the fabrication of the photoconductive layer 11 thereon. Similarly, it is preferable, although not necessary, that a similar layer 16 of zinc sulfide be fabricated upon the remaining surface 11b of the photoconductive layer. A second electrode 18 is fabricated either directly upon photoconductive layer surface 11b or, if film 16 of zinc sulfide is utilized, upon the surface of layer 16 furthest from photoconductive layer surface 11b. Electrode 18 is fabricated of any of the aforementioned materials, or of a metalized plastic material, to a thickness $T_2$ of between about 500 Angstroms to about 4 milli-inches. In one preferred embodiment, second electrode 18 is fabricated of aluminum with a nickel-coated steel electrode being used as first electrode 12.

The resistivity of the selenium layer is about $10^{15}$ ohm-cm and a 0.05 cm thick layer will have a dark resistance of about $2.5 \times 10^{13}$ ohms. The absorption coefficient of selenium, for X-radiation at about 100keV; is about 2/cm, whereby the product of the layer thickness A and the absorption coefficient is about 0.1 for 100keV. X-ray quanta.

The detector is positioned to receive X-ray quanta at some small angle $\theta$ to the normal N to one end plane 11c thereof, with absorption of the X-ray quanta occurring along the length B of the detector. Preferably, length B is from about 0.35 cm. to about 1 cm., with the larger values being preferred to reduce beam-hardening tracking errors. It will be seen that the response of the detector to scattered radiation quanta is minimized by reducing the angle $\theta$ at which quanta may enter the detection layer; the angle θ is related to the ratio of layer thickness A to layer length B and is optimized if surface 11c is substantially traverse to the planes of the opposed layer surfaces 11a and 11b. The width C of the quanta-receiving detector face is about two centimeters. The conversion efficiency of the detector is on the order of $2 \times 10^{-16}$ Coulombs per X-ray quanta, yielding a dark current shot noise level on the order of one X-ray equivalent in a one milli-second interval.

A potential source 20 is coupled to first electrode 12 with a positive potential of magnitude V, with respect to ground potential. Second electrode 18 is coupled to the input 25a of an operational amplifier 25 having its output 25b coupled both to input 25a through a feedback resistance $R_f$ and to electrical ground potential through an equivalent load resistance $R_1$. The electrical output signal of the detector is proportional to the magnitude of the radiation-responsive photoconductance and is taken from operational amplifier output 25b. Typically, magnitude V of potential source 20 is on the order of 5,000 volts, while the dark resistance of the detector, as previously mentioned, is on the order of $2.5 \times 10^{13}$ ohms, whereby a dark current of about 0.2 nanoamperes flows through the series circuit of the detector and the equivalent input resistance Req of the amplifier.

In operation, reception of radiation quanta, through detector surface 11c and into the volume of layer 11, increases electrical conductivity of layer 11 between electrodes 12 and 18. The increased conductive (or decreased resistance) increases the current flow through the detector layer and causes an increase in the magnitude of the output signal from the current-measuring amplifier 25. The output signal is thus varied in amplitude responsive to the intensity of radiation flux incident on the detector.

Referring now to FIG. 2, a solid state detector array 30 includes an insulative substrate 35 having a plurality N of electrodes 37a–37n fabricated upon a first surface 35a thereof, with each electrode being parallel to, but spaced from, each of the other electrodes. A thin film 39 of zinc sulfide may be fabricated over all of the parallel, spaced-apart electrodes 37. A layer of 42 of radiation-responsive photoconductive material is fabricated upon a portion of insulative substrate surface 35a (or upon film 39, if used) to cover the area bounded by all of the plurality of electrodes 37. The surface of photoconductive material layer 42 furthest from substrate 35 may be covered by a thin film 44 of zinc sulfide, and a conductive first electrode 46 is fabricated upon either the zinc sulfide layer 44 or, if layer 44 is not utilized, directly upon the surface of photoconductive layer 42 furthest from the substrate. Advantageously, first electrode 46 may extend across one edge of the photoconductive layer and onto a portion of the substrate 35, for mechanical stability. A potential source 20', of magnitude V, is coupled to electrode 46 to place a bias potential of positive polarity thereon to bias the photoconductive (e.g. selenium) layer 42.

Each detector of the array is defined by the photoconductive layer bounded by electrode 46 and by one of electrodes 37. Each elongated one of electrodes 37a–37n has a width of about 3 to 4 milli-inches with an electrode-to-electrode spacing S of about 5 milli-inches. The length L of each electrode is about 1 centimeter and the height H of the selenium photoconductor layer is on the order of 20 milli-inches. Thus, the array comprises a plurality of abutting detectors of about 5 milli-inches width, at the radiation-receiving surface. Each individual one of electrodes 37a–37n is coupled to the input of a like plurality of operational amplifiers 50a–50n, each having an associated feedback resistance $R_{f,1}$–$R_{f,n}$ coupled between the input and output thereof, and an equivalent load resistance $R_{L,1}$–$R_{L,n}$ coupled from the output thereof to ground. Each of the plurality of individual output signals $O_1$–$O_n$ appear at the output of the respective operational amplifiers 50a–50n, responsive to a change in the photoconductance P of the column of photoconductive material between electrode 46 and that one of electrodes 37a–37n associated with the operational amplifier from which a particular output is taken. Thus, if X-ray quanta impinge upon detector layer face 42a at an angle θ' to the normal N' thereto, and within the acceptance angle of the detector, each of the radiation quanta is absorbed in the volume of photoconductive layer associated with one of electrodes 37a–37n and increases the photoconductivity between that one of electrodes 37 and electrode 46, causing an increase in that associated one of output signals $O_1$–$O_n$, respectively.

While the present invention is described with reference to several presently preferred embodiments, many variations or modifications will now become apparent to those skilled in the art. It is my intent, therefore, to be limited only by the scope of the appending claims, and not by the specific details set forth herein.

What is claimed is:

1. A solid state radiation detector, comprising:
    a layer having first and second opposed surfaces, said layer being of a photoconductive material characterized by a change in the electrical conductance between said first and second opposed surfaces responsive to absorption of radiation quanta within said layer;
    a first electrode fabricated upon the first layer of said surface;
    a second electrode fabricated upon the second surface of said layer; and
    a film fabricated between at least one of said first and second layer surfaces and the associated one of said first and second electrodes, of a material selected to reduce the dark current of the photoconductor material of said layer.

2. The radiation detector of claim 1, further comprising means coupled between said first and second electrodes for biasing said photoconductive layer.

3. The radiation detector of claim 2, wherein said biasing means comprises a source of electrical potential.

4. The radiation detector of claim 1, further comprising means coupled to one of said first and second electrodes for measuring the magnitude of the photoconductivity across said detector layer and for providing an output signal proportional thereto.

5. The radiation detector of claim 4, wherein said current-measuring means comprises an operational amplifier having an input and an output, the input of said operational amplifier being coupled to said second electrode; a feedback resistance coupled between the input and output of said operational amplifier; and a load resistance coupled to the output of said operational amplifier and across which load resistance an output signal appears with magnitude responsive to the radiation flux intensity incident upon said detector layer.

6. The radiation detector of claim 1, wherein said film is fabricated of zinc sulfide.

7. The radiation detector of claim 6, wherein said film is fabricated to a thickness on the order of 1,000 angstroms.

8. The radiation detector of claim 1, wherein said photoconductive layer is fabricated of a material selected from the group consisting of lead oxide, cadmium selenide and selenium.

9. The radiation detector of claim 8, wherein said photoconductive layer material is selenium.

10. The radiation detector of claim 9, wherein the detector layer has a thickness, between said first and second opposed surfaces, on the order of 500 microns.

11. The radiation detector of claim 10, wherein said layer has a length, in the direction of radiation incidence, from about 0.35 centimeter to about 1 centimeter.

12. The radiation detector of claim 1, wherein the photoconductive layer has a radiation-receiving surface substantially transverse to, and extending between, said first and second opposed surfaces.

13. The radiation detector of claim 12, wherein the width of said radiation-receiving surface is about two centimeters.

14. The radiation detector of claim 1, wherein the photoconductive material has a dark resistance on the order of $10^{15}$ ohm-cm.

15. The radiation detector of claim 1, wherein each of said first and second electrodes is fabricated of a material selected from the group consisting of indium oxide, tin oxide, indium tin oxide, nickel, aluminum and gold.

16. The radiation detector of claim 1, wherein said first electrode is fabricated of nickel-coated tungsten.

17. The radiation detector of claim 1, wherein said first electrode has a thickness between about 500 Angstroms and about six milli-inches.

18. The radiation detector of claim 1, wherein the second electrode has a thickness between about 500 Angstroms and about four milli-inches.

19. A solid state radiation detector array comprising:
an insulative substrate having a surface;
a plurality of elongated first electrodes fabricated upon said substrate surface, each of said first electrodes being substantially parallel to, and spaced from, each adjacent first electrode;
a layer of a photoconductive material covering said plurality of the first electrodes and the substrate surface adjacent thereto, said photoconductive material characterized by a change in the electrical conductance between a first surface of said layer nearest to said plurality of electrodes and an opposite surface of said layer furthest from said plurality of electrodes, responsive to absorption of incident radiation quanta within said layer, said photoconductive layer having a surface substantially transverse to the first and second opposed surfaces, for reception of radiation quanta therethrough;
a sheet electrode fabricated upon said surface of said layer furthest from said plurality of first electrodes; and
a film of material disposed between said another surface of said photoconductive layer and said sheet electrode for reducing the magnitude of the dark current of the photoconductor material layer.

20. The detector array of claim 19, further comprising a film of zinc sulfide interposed between said layer first surface and all of said plurality of said first electrode.

21. The detector array of claim 20, wherein said film has a thickness of about 1000 Angstroms.

22. The detector array of claim 19, wherein said material is zinc sulfide.

23. The detector array of claim 22, wherein said material film has a thickness of about 1000 Angstroms.

24. The detector array of claim 19, wherein each of said elongated electrodes has a width of between about 3 and about 4 milli-inches.

25. The detector array of claim 24, wherein the spacing between adjacent one of said plurality of electrodes is about 5 milli-inches.

26. The detector array of claim 19, wherein said photoconductive layer has a thickness of about 20 milli-inches.

27. The detector array of claim 19, wherein each of the plurality of electrodes has a length, traverse to the radiation-receiving surface, of about 1 centimeter.

28. The detector array of claim 19, further comprising means coupled to at least said sheet electrode for biasing said photoconductive layer.

29. The detector array of claim 19, further comprising a plurality of means, each coupled to one of said plurality of elongated electrodes, for measuring the magnitude of the photoconductivity across that portion of the photoconductive layer between said one of said plurality of elongated electrodes and said sheet electrode and for providing an output signal proportional thereto.

* * * * *